(12) United States Patent
Ko et al.

(10) Patent No.: US 12,347,510 B2
(45) Date of Patent: Jul. 1, 2025

(54) BONDING DEFECT DETECTION FOR DIE-TO-DIE BONDING IN MEMORY DEVICES

(71) Applicant: Samsung Electronics Co., Ltd., Suwon-si (KR)

(72) Inventors: Junyoung Ko, Suwon-si (KR); Jungmin Bak, Suwon-si (KR); Changhwi Park, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 327 days.

(21) Appl. No.: 18/163,975

(22) Filed: Feb. 3, 2023

(65) Prior Publication Data
US 2023/0410934 A1    Dec. 21, 2023

(30) Foreign Application Priority Data

Jun. 16, 2022  (KR) .................. 10-2022-0073256
Aug. 26, 2022  (KR) .................. 10-2022-0107785

(51) Int. Cl.
*G11C 16/08* (2006.01)
*G11C 16/04* (2006.01)
*G11C 29/50* (2006.01)

(52) U.S. Cl.
CPC .............. *G11C 29/50004* (2013.01); *G11C 2029/5004* (2013.01)

(58) Field of Classification Search
CPC ...... G11C 29/50004; G11C 2029/5004; G11C 29/025
See application file for complete search history.

(56) References Cited

U.S. PATENT DOCUMENTS 9,329,225 B2    5/2016    Kim et al.
10,444,279 B2   10/2019   Chakrabarty et al.
(Continued)

FOREIGN PATENT DOCUMENTS

KR    100871964 B1    12/2008
KR    101711014 B1    2/2017
(Continued)

OTHER PUBLICATIONS

"J. Cho et al., "30.3 A 512Gb 3b/Cell 7th-Generation 3D-NAND Flash Memory with 184MB/s Write Throughput and 2.0Gb/s Interface," 2021 IEEE International Solid-State Circuits Conference (ISSCC), 2021, pp. 426-428, doi: 10.1109/ISSCC42613.2021. 9366054."

(Continued)

*Primary Examiner* — Hien N Nguyen
(74) *Attorney, Agent, or Firm* — Myers Bigel, P.A.

(57) ABSTRACT

A semiconductor device may include: a memory device that includes a memory cell, a page buffer, and a first switch having a first end that is electrically connected to a first node located at a bonding point of the memory cell and a second end that is connected to a second node located at the page buffer; and a memory controller that is configured to apply a pre-charge voltage to the first node and the second node in a first period, to close the first switch in a second period following the first period, and is configured to determine whether bonding between the memory cell and the first switch is defective based on a voltage of the second node after the first switch is closed.

20 Claims, 14 Drawing Sheets

(56) References Cited

U.S. PATENT DOCUMENTS

| | | | |
|---|---|---|---|
| 10,955,465 B2 | 3/2021 | Suto et al. | |
| 11,049,776 B2 | 6/2021 | Jung | |
| 2012/0150459 A1 | 6/2012 | Kim et al. | |
| 2020/0160910 A1* | 5/2020 | Hsu | G11C 16/32 |
| 2020/0381065 A1* | 12/2020 | Joe | G11C 16/0433 |
| 2020/0381316 A1* | 12/2020 | Lee | H01L 24/89 |
| 2021/0066143 A1 | 3/2021 | Jung | |
| 2022/0139895 A1* | 5/2022 | Choi | G11C 16/26 |
| | | | 365/185.13 |

FOREIGN PATENT DOCUMENTS

| | | | |
|---|---|---|---|
| KR | 20210026432 A | 3/2021 | |
| KR | 20210064961 A | 6/2021 | |
| KR | 20220048603 A | 4/2022 | |

OTHER PUBLICATIONS

"T. Tanaka et al., "7.7 A 768Gb 3b/cell 3D-floating-gate NAND flash memory," 2016 IEEE International Solid-State Circuits Conference (ISSCC), 2016, pp. 142-144, doi: 10.1109/ISSCC.2016.7417947."

"Y. Ouyang et al., "Excellent Reliability of Xtacking™ Bonding Interface," 2021 IEEE International Reliability Physics Symposium (IRPS), 2021, pp. 1-6, doi: 10.1109/IRPS46558.2021.9405115."

\* cited by examiner

BONDING DEFECT DETECTION FOR DIE-TO-DIE BONDING IN MEMORY DEVICES

CROSS-REFERENCE TO RELATED APPLICATIONS

This application claims priority to and the benefit of Korean Patent Application No. 10-2022-0073256, filed in the Korean Intellectual Property Office on Jun. 16, 2022, and Korean Patent Application No. 10-2022-0107785, filed in the Korean Intellectual Property Office on Aug. 26, 2022, and the entire contents of the above-identified applications are incorporated by reference herein.

TECHNICAL FIELD

The present disclosure relates to semiconductor devices.

BACKGROUND

Increasing demand for high-capacity memory devices, such as for big data applications, high-capacity servers, and artificial intelligence (AI) has led to corresponding increasing demand for new memory structures. As an example, new memory structures have been proposed in which a memory cell die and a peripheral circuit die are manufactured by separate processes, and the two dies are bonded. In such a structure, the peripheral circuit die can be manufactured by a relatively low temperature process, and thus the advantage of technology scaling can be obtained.

This structure may have numerous (e.g., millions) of bonding portions between the cell die and the peripheral circuit die for communication therebetween, and when the connection of the bonding portions is unstable, the yield of memory may be reduced.

SUMMARY

Aspects of the present disclosure provide semiconductor devices in which yield deterioration due to poor bonding connection may be prevented or lessened.

A semiconductor device according to some embodiments may include: a memory device that includes a memory cell, a page buffer, and a first switch having a first end that is electrically connected to a first node located at a bonding point of the memory cell and a second end that is connected to a second node located at the page buffer; and a memory controller that is configured to apply a pre-charge voltage to the first node and the second node in a first period, to close the first switch in a second period following the first period, and to determine whether bonding between the memory cell and the first switch is defective based on a voltage of the second node after the first switch is closed.

A semiconductor device according to some embodiments may include: a memory device that includes: a plurality of bit lines connected to a plurality of memory cells; a pre-charge circuit that is configured to pre-charge a first bit line among the plurality of bit lines with a first voltage and pre-charge a second bit line with a second voltage that is lower than the first voltage; and a sense amplifier that is configured to amplify a voltage difference between the first bit line and the second bit line and outputs the amplified value; and a memory controller that is configured to determine whether bonding of the plurality of memory cells is defective based on the output from the sense amplifier.

A semiconductor device according to some embodiments may include: a memory cell; a page buffer; a first switch having a first end that is connected with the memory cell at a first node and a second end that is connected with the page buffer at a second node; a second switch that is connected between a power source configured to supply a pre-charge voltage and the first node; and a third switch connected between the power source and the second node, wherein the page buffer includes: a latch; and a transistor that is connected between an input terminal of the latch and a ground terminal, and having a gate connected to the second node.

DETAILED DESCRIPTION

Figure 1:
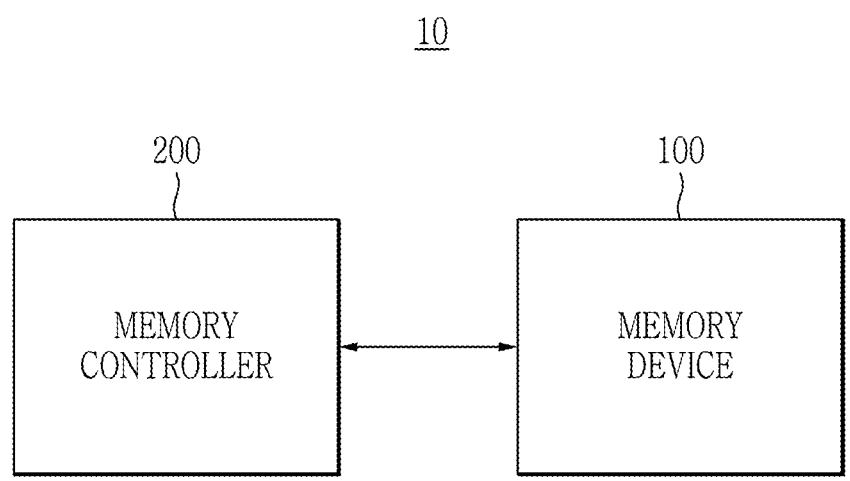
FIG. 1 is a schematic block diagram of a memory system according to some embodiments.

In the following detailed description, only some embodiments of the present inventive concepts have been shown and described, and the described embodiments provide merely illustrative (and not exhaustive) examples of the usages of the inventive concepts provided herein. As those skilled in the art will understand, the described embodiments may be modified in various different ways, all without departing from the scope of the present inventive concepts. Accordingly, the drawings and description are to be regarded as illustrative in nature and not restrictive. Like reference numerals may designate like elements throughout the specification. In the flowcharts shown and described herein, the order of operations may be changed, several operations may be merged, some operations may be divided, and/or specific operations may not be performed.

Herein, expressions written in the singular may be construed as singular or plural unless explicit expressions such as "one" or "single" are used. Terms including ordinal numbers such as first, second, and the like may be used to describe various configurations elements, but constituent elements are not limited by these terms. These terms may be used for the purpose of distinguishing one constituent element from other constituent elements.

FIG. 1 is a schematic block diagram of a memory system according to some embodiments.

Referring to FIG. 1, a memory system 10 may include a memory controller 100 and a memory device 200.

The memory controller 100 may control overall operation of the memory system 10. The memory controller 100 may write data to or read data from the memory device 200 using a command and an address. For example, the memory controller 100 and the memory device 200 may be connected using one or more separate pins and one or more separate transmission lines to exchange commands, addresses, or data.

The memory controller 100 may control the memory device 200 in response to an instruction from a host (not shown). The host may request a data processing operation, for example, a data read operation, a data write (program) operation, and/or a data erase operation of the memory system 10. In some embodiments, the host may be a central processing unit (CPU), a graphics processing unit (GPU), a microprocessor, or an application processor (AP).

The host may communicate with the memory controller 100 using an interface protocol such as a peripheral component interconnect express (PCIe), an advanced technology attachment (ATA), a serial ATA (SATA), a parallel ATA (PATA), and/or a serial attached SCSI (SAS). The interface protocol between the host and the memory controller 100 is not limited to the above-described examples, and in some embodiments a USB (Universal Serial Bus), MMC (Multi-Media Card), ESDI (Enhanced Small Disk Interface), or IDE (Integrated Drive Electronics), and/or the like can be implemented as the interface protocol.

The memory device 200 may be a volatile memory or a non-volatile memory.

For example, the memory device 200 may be a random access memory (DRAM) such as a double data rate synchronous dynamic random access memory (DDR SDRAM), a low power double data rate (LPDDR) SDRAM, a graphics double data rate (GDDR) SDRAM, a low power DDR (LPDDR), a rambus dynamic random access memory RDRAM, or the like.

As other examples, the memory device 200 may be a NAND flash memory, a vertical NAND (VNAND) flash memory, a bonding vertical NAND (BVNAND) flash memory, a NOR flash memory, a resistive random access memory (RRAM), a phase-change RAM (PRAM), a magneto resistive RAM (MRAM), a ferroelectrics RAM (FRAM), a spin transfer torque RAM (STT-RAM), or a conductive bridging RAM (CBRAM).

The memory device 200 may include a cell area and a peripheral circuit area. The cell area may include a memory cell array, and the peripheral circuit area may include constituent elements excluding the memory cell array. Each area may be formed by an individual die. In the memory device 200, the cell area and the peripheral circuit area may be connected using bonding. That is, a bonding area may be between the cell area and the peripheral circuit area. In some embodiments, the cell area and the peripheral circuit area may be connected using Cu-to-Cu bonding. The memory device 200 may include a plurality of bonding points for communication in the bonding area.

The memory controller 100 may be configured to detect a defective bonding point in the bonding area of the memory device 200. The memory controller 100 may be configured to detect the defective bonding point by using at least one of a voltage of a node in the cell area of the memory device 200 and/or a voltage of a node in the peripheral circuit area.

For example, parasitic resistance and parasitic capacitance may exist at a bonding point of the bonding area of the memory device 200. At the bonding point, parasitic capacitance and parasitic resistance between two components electrically connected by bonding may be formed. Hereinafter, in order to explain the electrical characteristics of the bonding point, the bonding point may be represented as an electrical node, and a resistor and a capacitor respectively representing the parasitic resistance and parasitic capacitance of the bonding point are connected to the node.

The capacitance corresponding to the parasitic capacitance of the bonding point may be charged during a first period or section of operation, and charging or discharging of the capacitance may be performed during a second period or section of operation following the first period or section. The memory controller 100 may detect whether the bonding point is defective based on a voltage value of the capacitor in the second period section. The memory controller 100 may determine that bonding is normal when the voltage value of the capacitor exceeds a reference voltage, and that bonding is defective when the voltage value of the capacitor does not exceed the reference voltage.

When the memory controller 100 detects a defective bonding point, it may be configured to perform a repair operation. For example, the memory controller 100 may be formed to reroute or detour a bit line connected to a defective bonding point to another bit line.

Figure 2:
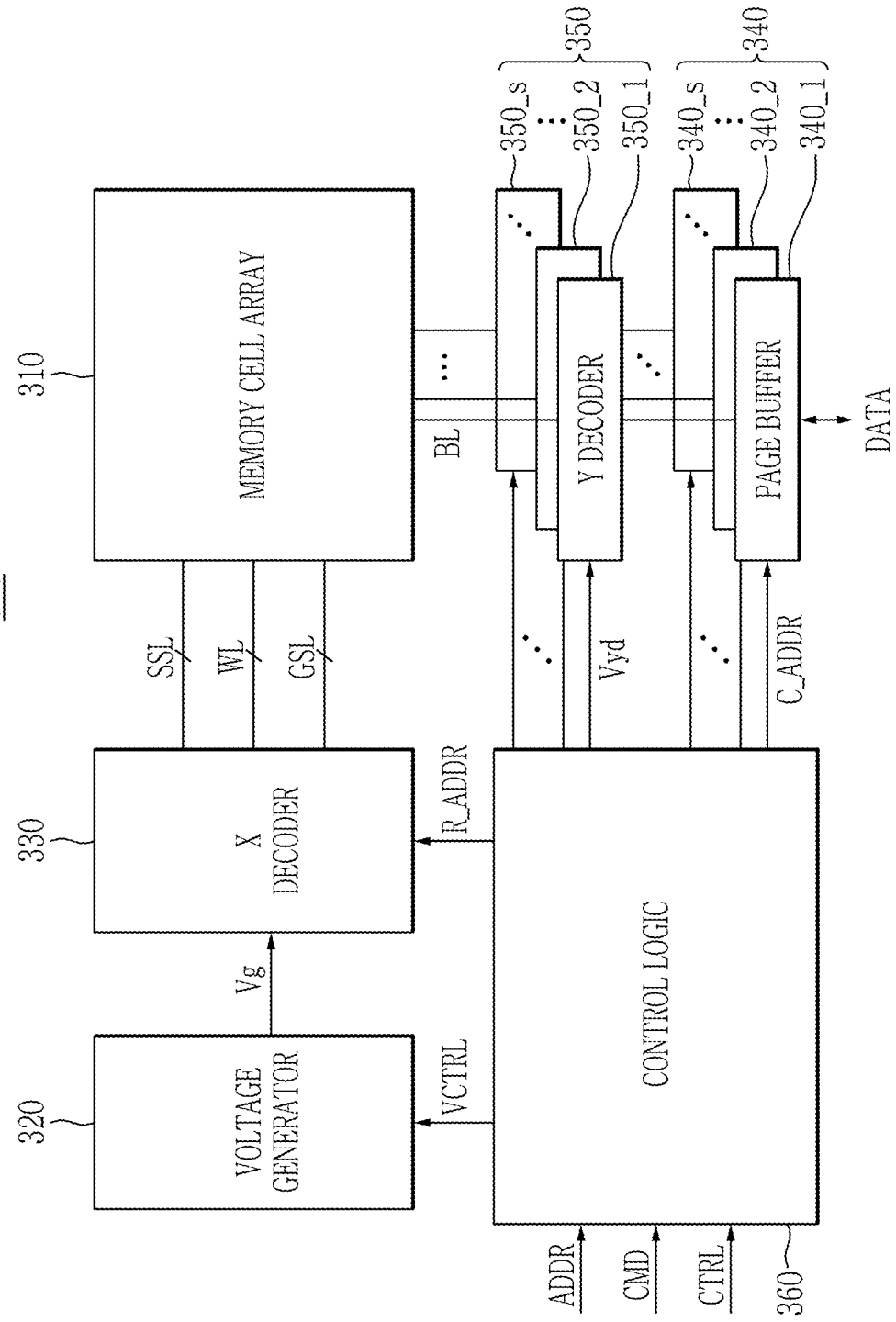
FIG. 2 is a schematic block diagram of a memory device according to some embodiments.

FIG. 2 is a schematic block diagram of a memory device according to the embodiment.

Referring to FIG. 2, the memory device 200 of FIG. 1 may be implemented as a memory device 300.

The memory device 300 may include a memory cell array 310, a voltage generator 320, an X decoder (or row decoder) 330, a page buffer (340), a Y decoder (or column decoder) 350, and a control logic 360.

The memory cell array 310 may be provided on a first die corresponding to the cell area, and constituent elements such as the page buffer 340 and the Y decoder 350 may be provided on a second die corresponding to the peripheral circuit area. The first die and the second die can be bonded through a process such as Cu-to-Cu bonding. That is, a bonding area may be positioned between the first die and the second die.

The bonding area may include a plurality of bonding points for communication between the first die and the second die. At each bonding point, there may be parasitic resistance and parasitic capacitance due to bonding. Parasitic resistance and parasitic capacitance may be expressed respectively as resistors and capacitors in an equivalent circuit.

The memory cell array 310 may include a plurality of memory blocks. Each of the plurality of memory blocks may be connected to the X decoder 330 through a word line WL, a string select line SSL, and a ground selection line GSL. Each of the plurality of memory blocks may be connected to the Y decoder 350 and the page buffer 340 through a bit line BL.

The memory cell array 310 may include a plurality of memory cells provided at areas where a plurality of word lines WL and a plurality of bit lines BL cross each other. Each memory cell may be used as a cell type such as a single-level cell (SLC), a multi-level cell (MLC), a triple-level cell (TLC), or a quad-level cell (QLC).

The memory cell array 310 may include a non-volatile memory cell. For example, the memory cell array 310 may include a 2D NAND memory array or a 3D vertical NAND (VNAND) memory array.

The voltage generator 320 may be configured to receive power, generate and/or regulate a voltage signal Vg for memory operation based on a voltage control signal VCTRL, and provide the voltage signal Vg to the memory cell array 310 through the X decoder 330.

The X decoder 330 may be connected to the memory cell array 310 through the word line WL, the string select line SSL, and the ground select line GSL. The X decoder 330 may select at least one of the plurality of memory blocks by decoding the row address R_ADDR. That is, the row decoder 330 may select the word line WL, the string selection line SSL, and the ground selection line GSL using the row address R_ADDR. The X decoder 330 may provide the voltage signal Vg supplied from the voltage generator 320 to the word line WL.

The page buffer 340 may include first to s-th page buffers 340_1 to 340_s. The first to s-th page buffers 340_1 to 340_s may be respectively connected to a plurality of memory cells through a plurality of bit lines BL (where, in some embodiments, 's' is an integer greater than or equal to 3). The page buffer 340 may select at least one bit line from among the plurality of bit lines BL based on a column address C_ADDR. The page buffer 340 may operate as a write driver or a sense amplifier according to an operation mode. For example, during a program operation, the page buffer 340 may receive data DATA from the memory controller 100 and may apply a bit line voltage corresponding to the data DATA to a selected bit line. During a read operation, the page buffer 340 may detect a current or voltage of a selected bit line, senses the data DATA stored in the memory cell array 310, and provides it to the memory controller 100.

The page buffer 340 may include a capacitor, a transistor, and a latch. A capacitor may be a factor according to parasitic capacitance. The capacitor, the transistor, and the latch may output data through respective operations in the pre-charge period and the sensing section. The operation of capacitors, transistors, and latches will be described later with reference to FIG. 3 to FIG. 6.

The memory device 300 may include a pre-charge circuit that outputs a pre-charge voltage in the pre-charge period, and switches that close in the pre-charge period and open in the sensing period. When the switch is closed, it can be understood that the switch is turned on, and when the switch is opened, it can be understood that the switch is turned off. The pre-charge circuit may generate a pre-charge voltage based on power output from a power management integrated circuit (PMIC) in the peripheral circuit area. For example, the memory device 300 may include a first switch that is provided in the peripheral circuit area and passes a pre-charge voltage to the memory cell array 310 in the pre-charge period, and a second switch that is provided in the peripheral circuit area and passes the pre-charge voltage to the page buffer 340. The first switch and second switch may be opened in the sensing period. The control logic 360 may control the switches using an internal signal that distinguishes the pre-charge period and the sensing period.

The memory controller 100 may detect a bad bonding point in the bonding area through the data acquired during sensing. For example, when a value different from the predetermined value is sensed in the page buffer 340 before sensing, the memory controller 100 may determine that bonding is normal. When the predetermined value in the page buffer 340 remains unchanged before sensing, the memory controller 100 may determine that bonding is defective.

The Y decoder 350 may include first to s-th Y decoders 350_1 to 350_s. Each of the first to s-th Y decoders 350_1 to 350_s may include a transistor. A transistor may be connected between the page buffer 340 and the memory cell array 310. The transistor may operate based on a voltage Vyd from the control logic 360. For example, when the voltage Vyd exceeds a threshold voltage of the transistor, it may be closed to connect the memory cell array 310 and the page buffer 340. When the voltage Vyd does not exceed the threshold voltage of the transistor, the transistor may be opened, and the memory cell array 310 and the page buffer 340 may be opened.

The control logic 360 may provide respective control signals related to memory operations to the voltage generator 320, the X decoder 330, the page buffer 340, and the Y decoder 350. The control logic 360 may control the overall operation of the memory device 300. The control logic 360 may control the memory device 300 by generating an internal control signal based on at least one of an address ADDR, a command CMD, and a control signal CTRL received from the memory controller 100. For example, the control logic 360 may generate a voltage control signal VCTRL for controlling the voltage generator 320, generate the voltage Vyd for controlling the Y decoder 350, and/or a row address R_ADDR and a column address C_ADDR based on the address ADDR. The control logic 360 may output the row address R_ADDR to the X decoder 330 or the column address C_ADDR to the page buffer 340.

Figure 3:
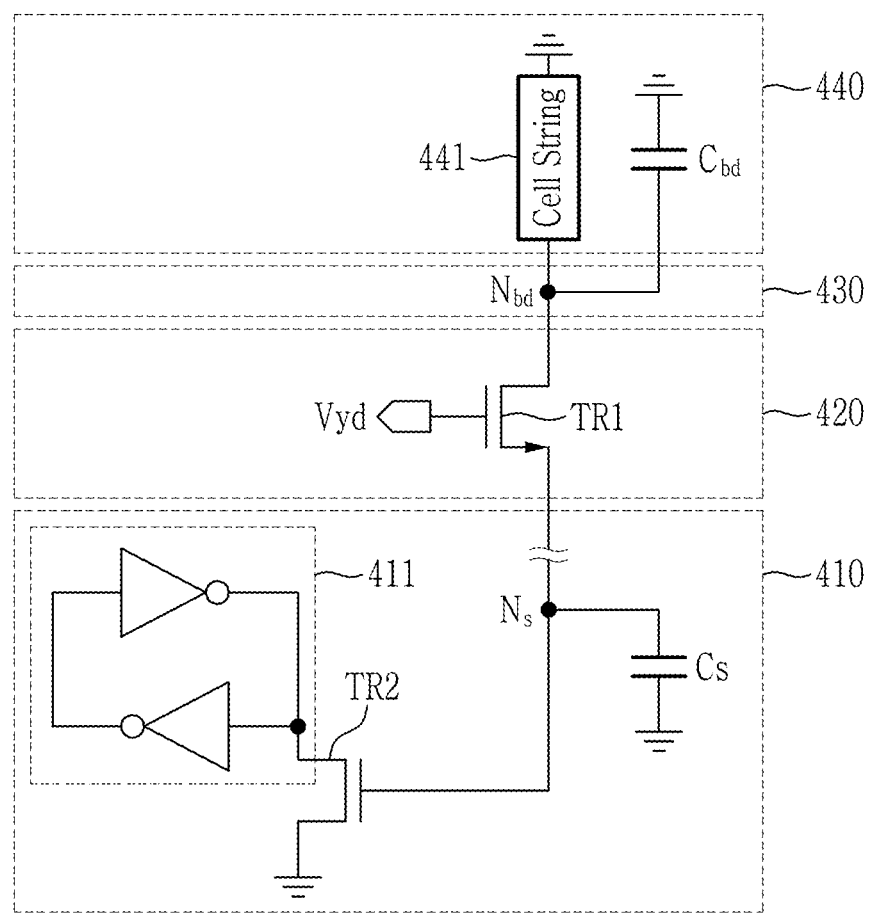
FIG. 3 is a circuit diagram of a part of the memory device according to some embodiments.
Figure 4:
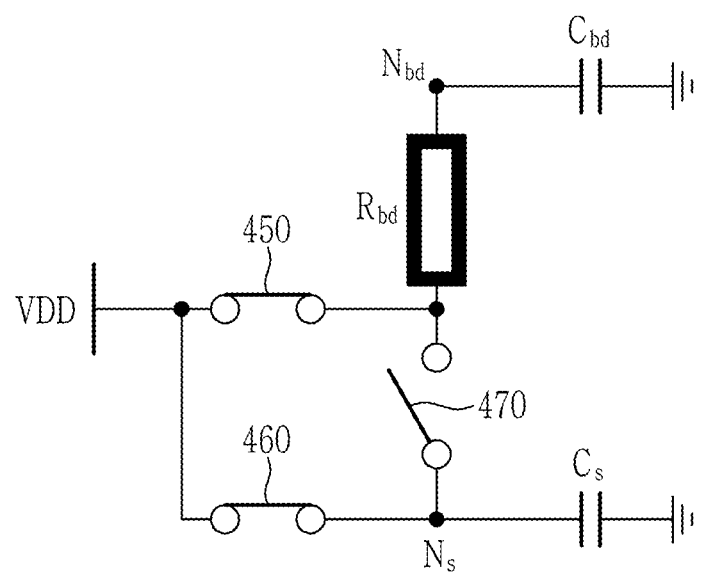
FIG. 4 is provided for description of the operation of a memory device according to some embodiments.
Figure 5:
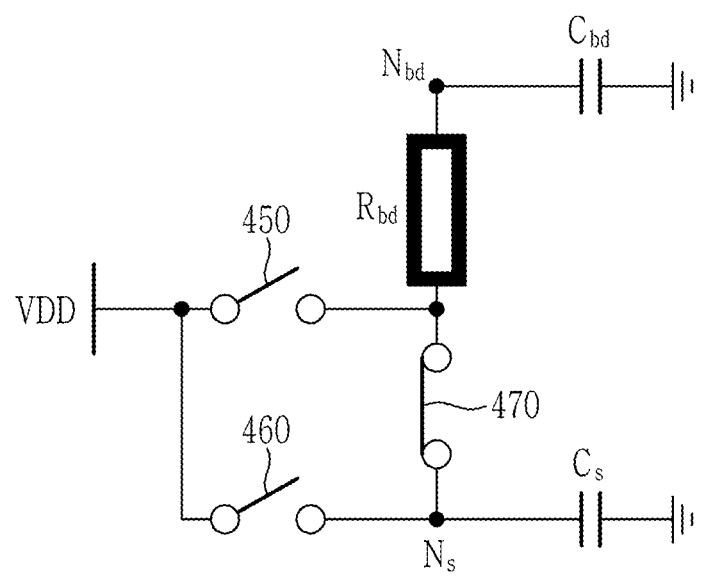
FIG. 5 is provided for description of the operation of a memory device according to some embodiments.
Figure 6:
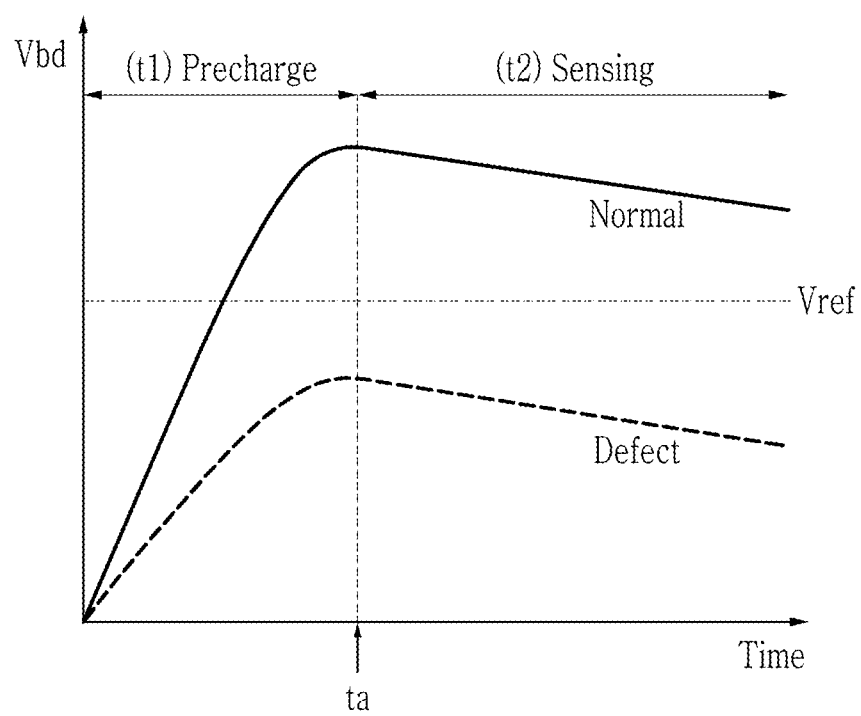
FIG. 6 is an example of a graph showing a voltage change of a bonding node in a bonding area.

FIG. 3 is a circuit diagram of a part of the memory device according to some embodiments, FIG. 4 is provided for description of the operation of a memory device according to some embodiments, FIG. 5 is provided for description of the operation of a memory device according to some embodiments, and FIG. 6 is an example of a graph showing a voltage change of a bonding node in a bonding area.

Referring to FIG. 3, the memory device may include a page buffer area 410, a Y decoder area 420, a bonding area 430, and a cell area 440. Here, the page buffer area 410 and the Y decoder area 420 may be formed in one die (e.g., a first die) as a peripheral circuit area, and the cell area 440 may be formed in another die (e.g., a second die different from the first die). The bonding area 430 may be an area where the cell area 440 and the peripheral circuit area are bonded, and may include numerous bonding points. In FIG. 3, one bonding point is illustrated for convenience of description.

The page buffer area 410 may include a latch 411 and a transistor TR2. Although a capacitor $C_s$ is also illustrated in the page buffer area 410, it represents the parasitic capacitance, and the capacitor $C_s$ may not actually be positioned in the page buffer area 410.

The page buffer area 410 may be connected to the Y decoder area 420 through a node $N_s$. The capacitor $C_s$ and a transistor TR2 may be connected to the node $N_s$. The capacitor $C_s$ may be charged using a voltage VDD applied during the pre-charge period. The voltage VDD may be a pre-charge voltage. The transistor TR2 may have a gate connected to the node $N_s$. Either drain or source of the transistor TR2 may be connected to the latch 411. The other one of a drain and a source of the transistor TR2 may be connected to ground. That is, the transistor TR2 may be connected between an input terminal of the latch 411 and a ground terminal. The latch 411 may store a predetermined value in advance. For example, the latch 411 may store a "1" bit.

In some embodiments, the memory device 300 may further include a switch between the transistor TR2 and the latch 411. The switch may be open in the pre-charge period to electrically separate the transistor TR2 and the latch 411, and may close in the sensing period following the pre-charge period to electrically connect the transistor TR2 and the latch 411.

The Y decoder area 420 may include the transistor TR1. The transistor TR1 may be closed when the voltage Vyd that is higher than the threshold voltage is applied to connect the cell area 440 and the page buffer area 410.

The bonding area 430 may include a node $N_{bd}$. When the bonding of the bonding area 430 is defective, electrons do not pass smoothly such that resistance may occur in the node $N_{bd}$.

The cell area 440 may include a cell string 441. Although a capacitor $C_{bd}$ is also illustrated in the cell area 440, it represents a parasitic capacitance, and the capacitor $C_{bd}$ may not actually be positioned in the cell area 440.

The cell string 441 may include a plurality of memory cells connected in series. The capacitor $C_{bd}$ may be connected or coupled to the node $N_{bd}$. The capacitor $C_{bd}$ may be charged using a voltage VDD applied during the pre-charge period.

The memory device may output data through the pre-charge period and the sensing period. The pre-charge period may precede the sensing period.

The operation of the memory device in the pre-charge period will be described with reference to FIGS. 4-6.

Referring to FIG. 4, the memory device may further include switches 450 and 460. In FIG. 4, the transistor TR1 of FIG. 3 is illustrated as the switch 470. When the bonding of the memory device is defective, the parasitic resistance of the bonding node of the memory device may be large. In FIG. 4, it is illustrated that parasitic resistance $R_{bd}$ of the bonding node is electrically connected between the node $N_{bd}$ and the switch 470. This is only an equivalent representation of the parasitic resistance for convenience of explanation, and the present disclosure is not limited thereto. The resistance connection that interrupts the electrical flow between the switch 470 and the bit line at the actual bonding point may be formed in various ways. When the bonding of the memory device is normal, the resistance is negligibly small and thus there may be no or minimal parasitic resistance $R_{bd}$ affecting normal operation of the memory device.

The voltage Vyd may not be supplied in the pre-charge period. That is, during the pre-charge period the transistor TR1 (switch 470) may be opened and thus the page buffer area 410 and the cell area 440 may be electrically separated. In the pre-charge period, the capacitor $C_s$ and the capacitor $C_{bd}$ may be respectively charged. In the pre-charge period, the switches 450 and 460 are closed such that the capacitor $C_s$ and the capacitor $C_{bd}$ may be respectively charged.

The voltage VDD may be applied (e.g., from control logic 360 and/or voltage generator 320). The magnitude and application time of the voltage VDD may be adjustable. For example, when bonding is normal, the magnitude and application time of the voltage VDD may be predetermined such that the voltage of the capacitor $C_s$ exceeds a threshold voltage of the transistor TR2 after the pre-charge period.

When the resistance $R_{bd}$ having a large resistance value is generated due to defective bonding, a voltage drop may occur and a voltage that is smaller than the voltage VDD may be applied to the node $N_{bd}$. That is, the capacitor $C_{bd}$ may be charged based on a voltage that is smaller than the voltage VDD. For example, when the capacitance of the capacitor $C_{bd}$ is C1 (F) and a voltage applied to the capacitor $C_{bd}$ is V1 (V), the accumulated charge stored in the capacitor $C_{bd}$ during the pre-charge period can be represented as C1*V1 (Q).

The node $N_s$ may be applied with the voltage VDD. When capacitance of the capacitor $C_s$ is C2 (F) and a voltage applied to the capacitor $C_s$ is V2 (V), the accumulated charge stored in the capacitor $C_s$ during the pre-charge period can be represented as C2*V2 (Q). V2 may be substantially equal to VDD.

Referring to FIG. 6, the voltage $V_{bd}$ change with time at the node $N_{bd}$ can be checked. Since the capacitor $C_{bd}$ is charged based on the voltage VDD in a pre-charge period t1, the voltage Vdb may increase as time lapses.

The magnitude and application time of the voltage VDD may be determined based on the voltage Vbd charged in the capacitor $C_{bd}$. For example, when a fixed first voltage is applied to the capacitor $C_{bd}$, a first time may be determined as a minimum value of the application time of the voltage VDD and the first voltage may be determined by the magnitude of the voltage VDD when the voltage of the capacitor $C_{bd}$ exceeds a reference voltage Vref after the first time. As another example, when a voltage is applied for a fixed time period, a second voltage at which the voltage of the capacitor $C_{bd}$ exceeds the reference voltage Vref may be determined as the minimum value of the magnitude of the voltage VDD and the fixed time may be determined as the application time of the voltage VDD.

In this case, when the bonding is defective and the resistance $R_{bd}$ has a large value, the voltage $V_{bd}$ may not exceed the reference voltage Vref depending on the voltage drop. In some embodiments, the reference voltage Vref may be the voltage $V_{bd}$ value that causes the voltage $V_S$ of the node $N_s$ to exceed the threshold voltage of the transistor TR2 in a sensing period t2 when bonding is normal. In some embodiments, the reference voltage Vref may be set to the threshold voltage of the transistor TR2.

In some embodiments, the memory device may further include a sensing circuit that measures the voltage $V_{bd}$ charged in the capacitor $C_{bd}$ at a time ta at which the pre-charge period ends. At the time ta, the sensing circuit may determine whether the voltage $V_{bd}$ exceeds the reference voltage Vref. When the voltage $V_{bd}$ exceeds the reference voltage Vref, the sensing circuit may determine that the bonding is normal. The sensing circuit may determine that the bonding is defective when the voltage $V_{bd}$ does not exceed the reference voltage Vref.

The operation of the memory device in the sensing period will be described with reference to FIG. 5.

Referring to FIG. 5, the voltage Vyd may be supplied in the sensing period. The voltage Vyd may be higher than the threshold voltage of the transistor TR1. That is, the switch 470 may be closed, and the page buffer area 410 and the cell area 440 may be electrically connected. In this case, since the node $N_{bd}$ and the node $N_s$ are connected, the capacitor $C_s$ and the capacitor $C_{bd}$ may share charges.

In the sensing period, the voltage $V_S$ of the capacitor $C_s$ may be as given in Equation 1.

$$V_S = \frac{C1*V1 + C2*V2}{C1+C2} \quad \text{(Equation 1)}$$

Here, $V_S$ may denote a voltage of the node $N_s$ in the sensing period, C1 is capacitance of the capacitor $C_{bd}$, C2 is capacitance of the capacitor $C_s$, V1 is a voltage charged to the capacitor $C_{bd}$ in the pre-charge period, and V2 may be a voltage charged to the capacitor $C_s$ in the pre-charge period. C1 may be larger than C2.

When the voltage $V_S$ is higher than the threshold voltage of the transistor TR2 of FIG. 3, the transistor TR2 may pass a current and, accordingly, the logic level of the latch 411 may be switched. The threshold voltage of transistor TR2 may be determined based on distribution. For example, the latch 411 maintaining a high level in the pre-charge period may be shifted to a low level when the voltage $V_S$ is higher than the threshold voltage of the transistor TR2 in the sensing period.

That is, when the bonding of the bonding area 430 is normal, the logic level of the latch 411 is switched, and when the bonding is defective, the logic level of the latch 411 is not switched and a previously predetermined value can be maintained.

Accordingly, the memory controller 100 may determine whether bonding is defective based on the logic level (or logic value) of the latch 411 in the sensing period. For example, when the value of the latch 411 is changed from "1" to "0", the memory controller 100 determines that bonding is normal, and when the value of the latch 411 is not changed and the previous value is maintained, the memory controller 100 may determine that the bonding is defective. The memory controller 100 may perform a repair operation when is determined or detected that bonding is defective.

Referring to FIG. 6, since the capacitor $C_{bd}$ and the capacitor $C_s$ share the charge in the sensing period t2, the voltage $V_{bd}$ may drop. In this case, when the capacitor $C_{bd}$ is not charged sufficiently due to defective bonding, the voltage of the capacitor $C_s$ may not exceed the threshold voltage of the transistor TR2 after sharing the charge. Accordingly, since the transistor TR2 is open, the latch 411 may maintain a previous logic level. The memory controller 100 may determine whether bonding is defective based on the logic level of the latch 411.

Figure 7:
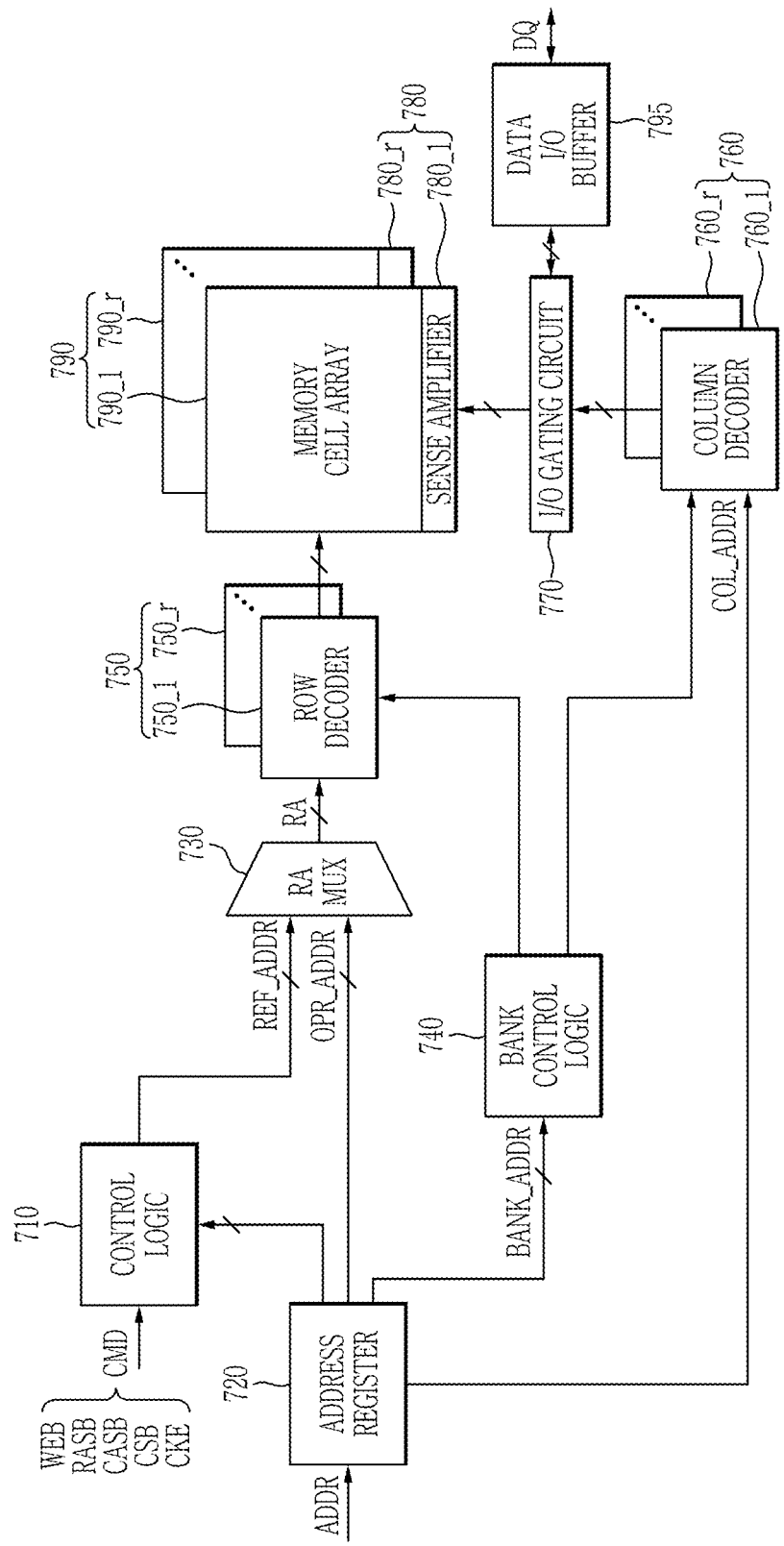
FIG. 7 is a schematic block diagram of a memory device according to some embodiments.

FIG. 7 is a schematic block diagram of a memory device according to some embodiments.

Referring to FIG. 7, the memory device 200 of FIG. 1 may be implemented as a memory device 700.

The memory device 700 may include a control logic 710, an address register 720, a row address multiplexer 730, a bank control logic 740, a plurality of row decoders 750, a plurality of column decoders 760, an input and output gating circuit 770, a plurality of sense amplifiers 780, a plurality of memory cell arrays 790, and a data input/output buffer 795.

The plurality of memory cell arrays 790 may be provided on a first die corresponding to a cell area, and a plurality of constituent elements such as the sense amplifier 780 may be provided on a second die corresponding to a peripheral circuit area. The first die and the second die may be bonded through a process such as Cu-to-Cu bonding. That is, a bonding area may be positioned between the first die and the second die.

The bonding area may include a plurality of bonding points for communication between the first die and the second die. At each bonding point, there may be parasitic resistance and parasitic capacitance due to bonding. Parasitic resistance and parasitic capacitance may be expressed respectively as resistors and capacitors in an equivalent circuit.

The plurality of memory cell arrays 790 and the plurality of sense amplifiers 780 may be connected respectively to each other through bit lines (or bit line bars) and complementary bit lines. In an equivalent circuit, it may be expressed that a capacitor due to parasitic capacitance is connected to the bit line and the complementary bit line, respectively. For one bit line, a corresponding at least one complementary bit line may be positioned. The memory controller 100 may determine whether bonding is defective based on at least one of a voltage of a capacitor connected to the bit line and/or a voltage of a capacitor connected to the complementary bit line.

The capacitor of the bit line, the capacitor of the complementary bit line, and the plurality of sense amplifiers 780 may output data through respective operations in a pre-charge period and a sense amplification period. For the operation of the capacitor of the bit line, the capacitor of the complementary bit line, and the plurality of sense amplifiers 780 will be described later with reference to FIG. 8 to FIG. 11.

The control logic 710 may be configured to decode a command CMD received from the memory controller 100, generate a refresh row address REF_ADDR based on an address received from an address register 720, and output the refresh row address REF_ADDR to the row address multiplexer 730. The command CMD may include a write enable signal WEB, a row address strobe signal RASB, a column address strobe signal CASB, a chip select signal CSB, a clock enable signal CKE, and/or the like.

The row address multiplexer 730 may receive a refresh row address REF_ADDR and an operation row address OPR_ADDR. The row address multiplexer 730 may selectively output the refresh row address REF_ADDR or the operation row address OPR_ADDR as the row address RA to the row decoder 750. The refresh row address REF_ADDR may be an address for cell refresh, and the operation row address OPR_ADDR may be an address for writing, reading, and/or erasing.

The address register 720 may receive the address ADDR from the memory controller 100. The address ADDR may include a bank address BANK_ADDR, an operation row address OPR_ADDR, and a column address COL ADDR. The address register 720 may provide the operation row address OPR_ADDR to the row address multiplexer 730, may provide the bank address BANK_ADDR to the bank control logic 740, and may provide the column address COL ADDR to the column decoder 760.

The bank control logic 740 may generate a bank control signal in response to the bank address BANK_ADDR, and may output the bank control signal to a plurality of row decoders 750 and a plurality of column decoders 760. The plurality of row decoders 750 may include first to r-th row decoders 750_1 to 750_r (where, in some embodiments, 'r' is an integer greater than 1). The plurality of column decoders 760 may include first to r-th column decoders 760_1 to 760_r (r is an integer greater than 1). In response to the bank control signal, the row decoder corresponding to the bank address BANK_ADDR among the first to r-th row decoders 750_1 to 750_r may be activated, and a column decoder corresponding to the bank address BANK_ADDR among the first to r-th column decoders 760_1 to 760_r may be activated.

The plurality of memory cell arrays 790 may include first to r-th memory cell arrays 790_1 to 790_r (r is an integer greater than 1). That is, the number of the plurality of memory cell arrays 790 may be the same as the number of the plurality of row decoders 750 and the number of the plurality of column decoders 760. For example, r may be implemented as 8, 16, 32, or the like.

The first to r-th row decoders 750_1 to 750_r may be respectively connected to the first to r-th memory cell arrays 790_1 to 790_r. The first to r-th row decoders 760_1 to 760_r may be respectively connected to the first to r-th memory cell arrays 790_1 to 790_r. In addition, the plurality of sense amplifiers 780 may include first to r-th sense amplifiers 780_1 to 780_r that are respectively connected to the first to r-th memory cell arrays 790_1 to 790_r.

The first to r-th row decoders 750_1 to 750_r, the first to r-th row decoders 760_1 to 760_r, the first to r-th sense amplifiers 780_1 to 780_r, and the first to r-th memory cell arrays 790_1 to 790_r may respectively form the first to r-th banks. Each of the first to r-th memory cell arrays 790_1 to 790_r may include a plurality of word lines, a plurality of bit lines, and a plurality of memory cells formed at intersections of the word lines and the bit lines. Each memory cell may have a DRAM cell structure. A word line to which a memory cell is connected may be defined as a row, and a bit line to which a memory cell is connected may be defined as a column.

Among the first to r-th row decoders 750_1 to 750_r, the row decoder 750 that is activated by the bank control logic 740 may decode the row address RA output from the row address multiplexer 730, and may activate a word line corresponding to the row address RA. For example, the activated row decoder may apply a word line driving voltage to a word line corresponding to the row address RA.

The column decoder 760 may activate the sense amplifier 780 through the input and output gating circuit 770. For example, among the first to r-th row decoders 760_1 to 760_r, a column decoder activated by the bank control logic 740 may activate a sense amplifier corresponding to the bank address BANK_ADDR and the column address COL ADDR among the first to r-th sense amplifiers 780_1 to 780_r through the input and output gating circuit 770.

The input and output gating circuit 770 may include a circuit for gating input and output data, an input data mask logic, a read data latch for storing data output from the memory cell array 790, and/or a write driver for writing data to the memory cell array 790.

Data DQ read from one of the first to r-th memory cell arrays 790_1 to 790_r may be sensed by a sense amplifier corresponding to the memory cell array and stored in the read data latch. The data DQ stored in the read data latch may be provided to the memory controller 100 through the data input and output buffer 795. In addition, the data DQ to be written into one of the first to r-th memory cell arrays 790_1 to 790_r may be provided from the memory controller 100 to the data input and output buffer 795. The data DQ provided to the data input and output buffer 795 may be written into one memory cell array through write drivers.

Figure 8:
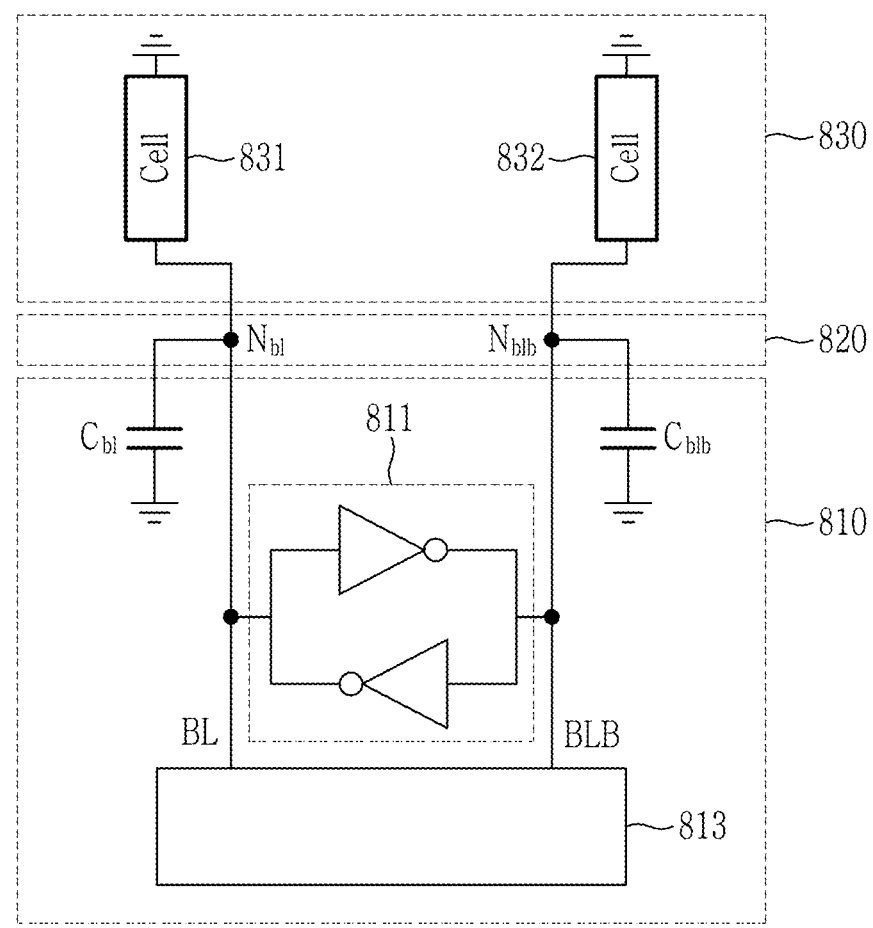
FIG. 8 shows a part of a circuit diagram of a memory device according to some embodiments.
Figure 9:
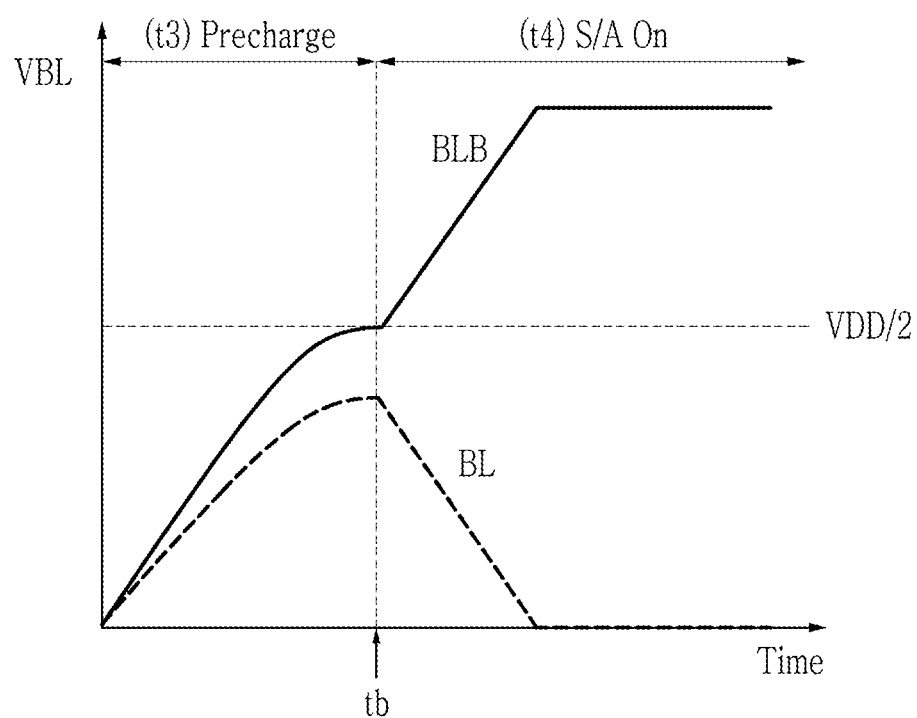
FIG. 9 is an example of a graph showing the voltage change of the bonding node in the bonding area.
Figure 10:
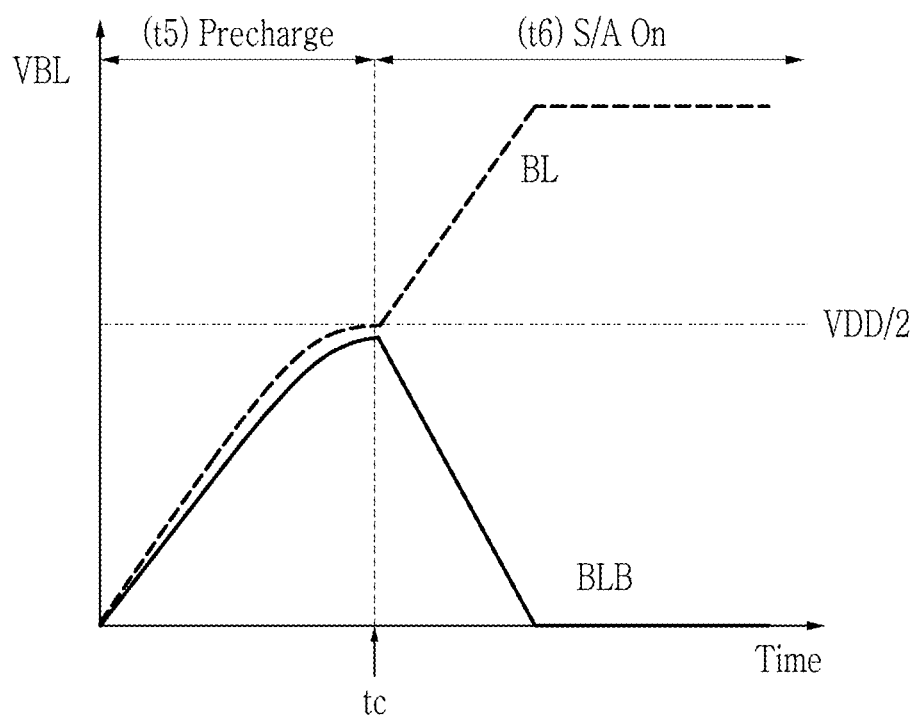
FIG. 10 is an example of a graph showing the voltage change of the bonding node in the bonding area.

FIG. 8 shows a part of a circuit diagram of a memory device according to some embodiments. FIG. 9 is an example of a graph illustrating a voltage change of a bonding node of a bonding area. FIG. 10 is an example of a graph illustrating a voltage change of a bonding node of a bonding area.

Referring to FIG. 8, a memory device may include a sense amplifier area 810, a bonding area 820, and a cell area 830. Here, the sense amplifier area 810 may be formed in one die (e.g., a first die) as a peripheral circuit area, and the cell area 830 may be formed in another die (e.g., a second die). The bonding area 820 is an area where the cell area 830 and the peripheral circuit area are bonded, and may include numerous bonding points. In FIG. 8, for convenience of explanation, two bonding points for the bit line BL and the complementary bit line BLB are illustrated.

The sense amplifier area 810 may include a bit line BL, a complementary bit line BLB, a latch 811, and a pre-charge circuit 813.

A capacitor $C_{b1}$ and a capacitor $C_{b1b}$ are also illustrated in the sense amplifier area 810, but represent parasitic capacitances of the bonding area 820, and capacitors may not actually be positioned in the sense amplifier area 810. The bit line BL, the complementary bit line BLB, the capacitor $C_{b1}$, the capacitor $C_{b1b}$, the latch 811, and the pre-charge circuit 813 may output data through their respective operations in the pre-charge period and the sense amplification period.

The bit line BL may connect the sense amplifier area 810 and the cell area 830. During the pre-charge period, the pre-charge circuit 813 may apply a first voltage to the bit line BL.

The capacitor $C_{b1}$ may be connected with the bit line BL through the node $N_{b1}$, and may be changed based on a first voltage in the pre-charge period.

The complementary bit line BLB may connect the sense amplifier area 810 and the cell area 830. During the pre-charge period, the pre-charge circuit 813 may apply a second voltage to the complementary bit line BLB. The second voltage may be lower than the first voltage. The pre-charge circuit 813 may not apply a voltage to the bit line BL or the complementary bit line BLB during the sensing period. For example, a switch may be between the pre-charge circuit 813, and the bit line BL and the complementary bit line BLB.

The capacitor $C_{b1b}$ may be connected with the complementary bit line BLB through the node $N_{b1b}$, and may be charged based on the second voltage in the pre-charge period.

When the bonding to the node $N_{b1}$ of the bonding area 820 is defective and the bonding to the $N_{b1b}$ is normal, charges charged to the capacitor $C_{b1}$ may be smaller than charges charged to the capacitor $C_{b1b}$.

When the bonding to the node $N_{b1}$ and to the node $N_{b1b}$ of the bonding area 820 are both normal, the charges charged to the capacitor $C_{b1}$ may be larger than the charges charged to the capacitor $C_{b1b}$.

The latch 811 may be connected to the bit line BL and the complementary bit line BLB. For example, the latch 811 may include a first inverter and a second inverter. An output terminal of the first inverter and an input terminal of the second inverter may be connected to the bit line BL. The input terminal of the first inverter and the output terminal of the second inverter may be connected to the complementary bit line BLB.

The latch 811 may operate in a sense amplification period following the pre-charge period. The latch 811 may be in an off state during the pre-charge period. The latch 811 may amplify a voltage difference between a voltage of the bit line BL and a voltage of the complementary bit line BLB in the sense amplification period. That is, when the voltage of the capacitor $C_{b1}$ is higher than the voltage of the capacitor $C_{b1b}$ in the pre-charge period, the amplification result in the sense amplification period may show that the bit line BL becomes high level and the complementary bit line BLB becomes low level. When the voltage of the capacitor $C_{b1}$ is lower than the voltage of the capacitor $C_{b1b}$ in the pre-charge period, then during the sense amplification period the amplification result may show that the bit line BL becomes a low level and the complementary bit line BLB becomes a high level.

The memory controller 100 may determine or detect whether bonding of the bonding area 820 is defective based on the output from the latch 811 in the sense amplification period. For example, the memory controller 100 may determine whether bonding of the bonding area 820 is defective based on at least one of the voltage of the bit line BL and/or the voltage of the complementary bit line BLB according to the amplification result in the sense amplification period. When the bit line BL becomes low level according to the amplification result, the memory controller 100 may determine that bonding of the node $N_{b1}$ in the bonding area 820 is defective.

The cell area 830 may include a cell string 831 and a cell string 832. The cell string 831 is connected to the bit line BL, and may include a plurality of memory cells connected in series. The cell string 832 is connected to the complementary bit line BLB, and may include a plurality of memory cells connected in series.

The bonding area 820 may connect the sense amplifier area 810 and the cell area 830 through the bit line BL and the complementary bit line BLB.

Referring to FIG. 9, when bonding to the node $N_{b1}$ of the bonding area 820 is defective and bonding to the node $N_{b1b}$ is normal, the voltage change of the bit line BL and the voltage change of the complementary bit line BLB can be checked.

In a pre-charge period t3, as the capacitor $C_{b1}$ may be charged based on the first voltage and the capacitor $C_{b1b}$ may be charged based on the second voltage, the voltage of the bit line BL and the voltage of the complementary bit line BLB may increase. Although the first voltage is higher than the second voltage, it can be seen that the capacitor $C_{b1}$ is not sufficiently charged at a time tb when the pre-charge period t3 ends because the bonding to the node $N_{b1}$ is defective.

During a sense amplification period t4, the latch 811 may amplify a difference between the voltage of the bit line BL and the voltage of the bit line BLB. Since the voltage of the bit line BL is lower than the voltage of the bit line BLB at time point tb, the bit line BL becomes low level and the complementary bit line BLB becomes high level in the sense amplification period t4. Accordingly, the memory controller 100 may determine that the bonding of the node $N_{b1}$ is defective based on the low-level bit line BL.

Referring to FIG. 10, when the bonding to the node $N_{b1}$ and the node $N_{b1b}$ of the bonding area 820 are both normal, the voltage change of the bit line BL and the voltage change of the complementary bit line BLB can be checked.

In a pre-charge period t5, as the capacitor $C_{b1}$ is charged based on the first voltage and the capacitor $C_{b1b}$ is charged based on the second voltage, the voltage of the bit line BL and the voltage of the complementary bit line BLB may increase. Since the first voltage is higher than the second voltage, it can be checked that the voltage of the bit line BL is higher than the voltage of the complementary bit line BLB at a time tc where the pre-charge period t5 ends.

In a sense amplification period t6, the latch 811 may amplify a difference between the voltage of the bit line BL and the voltage of the bit line BLB. Since the voltage of the bit line BL is higher than the voltage of the bit line BLB at the time tc, the bit line BL becomes high level and the complementary bit line BLB becomes low level in the sense amplification period t6. Accordingly, the memory controller 100 may determine that the bonding of the node $N_{b1}$ is normal based on the high-level bit line BL.

In FIG. 9 and FIG. 10, for convenience of description, it is shown that the voltage value of the complementary bit line BLB becomes VDD/2 V at the time point tb, or the voltage value of the bit line BL becomes VDD/2 V at the time point tc, but the present disclosure is not limited thereto. For example, the first voltage applied to the bit line BL is implemented to be higher than the second voltage applied to the complementary bit line BLB, and the first voltage and/or second voltage may be higher or lower than VDD/2 V. In addition, the times tb and tc are not necessarily determined by the time when the voltage of the bit line BL or the voltage of the complementary bit line BLB becomes VDD/2 V, but in some embodiments may be based on a determined time for a difference to develop between the voltage of the bit line BL and the voltage of the complementary bit line BLB.

Figure 11:
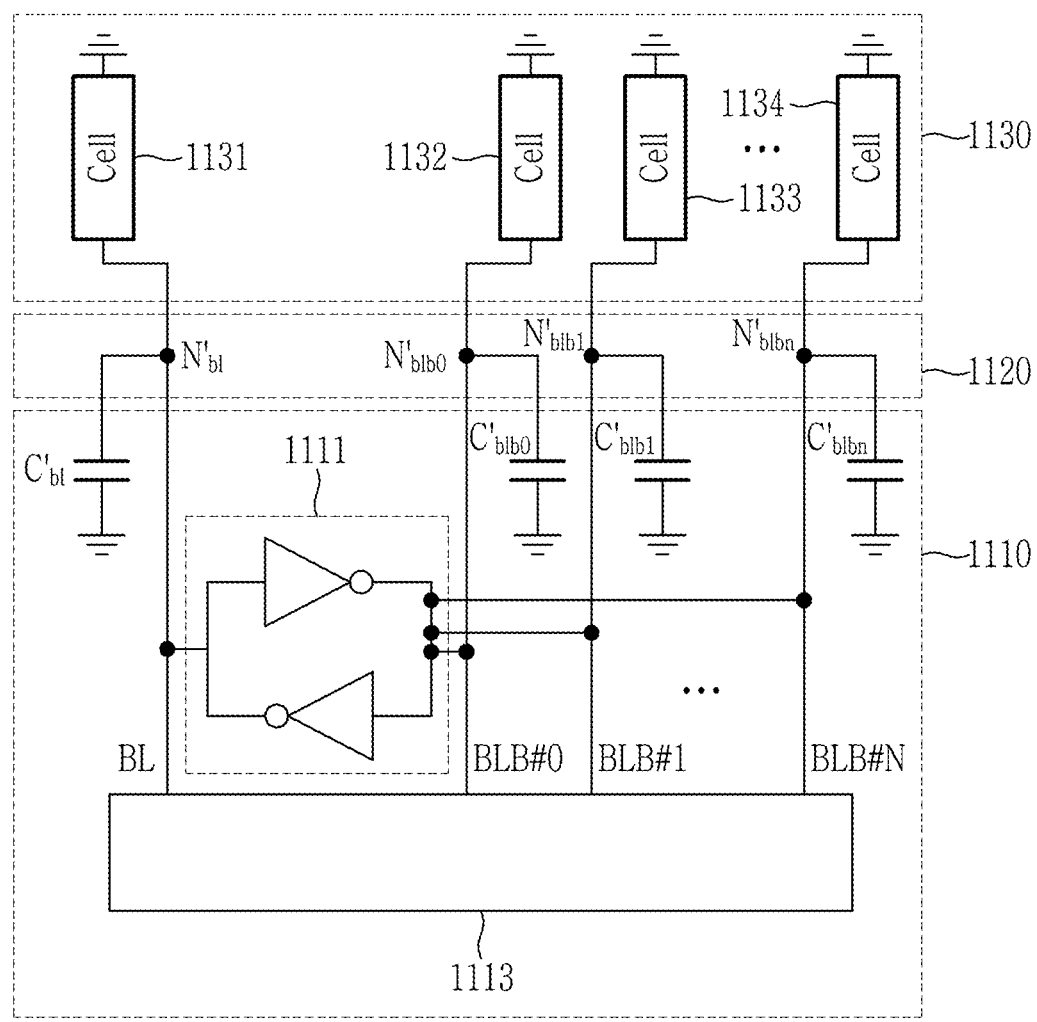
FIG. 11 shows a part of a circuit diagram of a memory device according to some embodiments.

FIG. 11 shows a part of a circuit diagram of a memory device according to some embodiments.

Referring to FIG. 11, a memory device may include a sense amplifier area 1110, a bonding area 1120, and a cell area 1130. Here, the sense amplifier area 1110 may be formed in one die (e.g., a first die) as a peripheral circuit area, and the cell area 1130 may be formed in another die (e.g., a second die). The bonding area 1120 may be an area where the cell area 830 and the peripheral circuit area are bonded, and may include numerous bonding points. In FIG. 11, (n+2) bonding points for a bit line BL and (n+1) complementary bit lines (BLB #0 to BLB #n) are illustrated. Here, 'n' may be an integer greater than 1.

The sense amplifier area 1110 may include a bit line BL, complementary bit lines BLB #0 to BLB #n, a latch 1111, and a pre-charge circuit 1113. Although it is also illustrated that a capacitor $C_{b1}$ and capacitors $C'_{b1b0}$ to $C'_{b1bn}$ are positioned in the sense amplifier area 1110, these represent parasitic capacitances of the bonding area 1120, and the capacitors may not be actually positioned in the sense amplifier area 1110. The bit line BL, the complementary bit lines BLB #0 to BLB #n, the capacitor $C'_{b1}$, the capacitors $C'_{b1b0}$ to $C'_{b1bn}$, the latch 1111, and the pre-charge circuit 1113 may output data through operations respectively during a pre-charge period and a sense amplification period.

The bit line BL may connect the sense amplifier area 1110 and the cell area 1130. During the pre-charge period, the pre-charge circuit 1113 may apply a first voltage to the bit line BL.

The capacitor $C'_{b1}$ may be connected to the bit line BL through the node $N'_{b1}$ of the bonding area 1120. The capacitor $C'_{b1}$ may be charged based on the first voltage in the pre-charge period.

The complementary bit lines BLB #0 to BLB #n may connect the sense amplifier area 1110 and the cell area 1130. During the pre-charge period, the pre-charge circuit 1113 may apply a second voltage to the complementary bit lines BLB #0 to BLB #n. The second voltage may be lower than the first voltage. The pre-charge circuit 1113 may not apply a voltage to the bit line BL and the complementary bit lines BLB #0 to BLB #n in the sensing period. For example, a switch may be disposed between the pre-charge circuit 1113, and the bit line BL and the complementary bit lines BLB #0 to BLB #n.

The capacitors $C'_{b1b0}$ to $C'_{b1bn}$ in may be connected with the complementary bit lines BLB #0 to BLB #N through the nodes $N'_{b1b0}$ to $N'_{b1bn}$ of the bonding area 1120. The capacitors $C'_{b1b0}$ to $C'_{b1bn}$ may be charged based on the second voltage in the pre-charge period.

When the bonding to the node N'm of the bonding area 1120 is defective and the bonding to the nodes $N'_{b1b0}$ to $N'_{b1b0}$ is normal, the charge charged in the capacitor $C'_{b1}$ may be smaller than the charge charged to each of the capacitors $C'_{b1b0}$ to $C'_{b1bn}$.

When the bonding to the node $N'_{b1}$ of the bonding area 1120 and the bonding to the nodes $N'_{b1b0}$ to $N'_{b1bn}$ are normal, the charge charged in the capacitor $C'_{b1}$ may be larger than the charge charged to each of the capacitors $C'_{b1b0}$ to $C'_{b1bn}$.

The latch 1111 may be connected to the bit line BL and the complementary bit lines BLB #0 to BLB #n. For example, the latch 1111 may include a first inverter and a second inverter. The output terminal of the first inverter and the input terminal of the second inverter may be connected to the bit line BL. An input terminal of the first inverter and an output terminal of the second inverter may be connected to the complementary bit lines BLB #0 to BLB #n. The latch 1111 may operate in a sense amplification period following the pre-charge period. The latch 1111 may be in an off state during the pre-charge period. The latch 1111 may amplify a difference between the voltage of the bit line BL and an average value (average voltage value) of voltages of the complementary bit lines BLB #0 to BLB #n in the sense amplification period. That is, when the voltage of capacitor $C_{b1}$ is higher than the average voltage value of the capacitors $C'_{b1b0}$ to $C'_{b1bn}$ in the pre-charge period, the amplification result shows that the bit line BL becomes high level and the complementary bit lines BLB #0 to BLB #n may be low level in the sense amplification period. When the voltage of the capacitor $C'_{b1}$ is lower than the average voltage value of the capacitors $C'_{b1b0}$ to $C'_{b1bn}$ in the pre-charge period, then during the sense amplification period the amplification result shows that the bit line BL becomes low level and the complementary bit lines BLB #0 to BLB #n become high level.

The memory controller 100 may determine whether bonding of the bonding area 1120 is defective based on at least one of the voltage of the bit line BL and the voltage of the complementary bit lines BLB #0 to BLB #N according to the amplification result in the sense amplification period.

For example, when the bonding to the node $N'_{b1}$ is normal and the bonding to the nodes $N'_{b1b0}$ to $N'_{b1bn}$ is normal, the first voltage applied to the bit line BL may be higher than the second voltage applied to the complementary bit lines BLB #0 to BLB #N, and thus the bit line BL may be at a high level according to the amplification result in the sense amplification period. The memory controller 100 may determine that bonding to the node $N'_{b1}$ is normal in response to the bit line BL being at a high level.

When the bonding to the node $N'_{b1}$ is normal and at least one of bondings to the nodes $N'_{b1b0}$ to $N'_{b1bn}$ is defective, the bit line BL may be at a high level according to the amplification result in the sense amplification period. The memory controller 100 may determine that bonding to the node $N'_{b1}$ is normal in response to the bit line BL being at a high level.

When the bonding to the node $N'_{b1}$ is defective and the bonding to the nodes $N'_{b1b0}$ to $N'_{b1bn}$ is normal, the voltage of the node $N'_{b1}$ may become lower than the average voltage value of the nodes $N'_{b1b0}$ to $N'_{b1bn}$, and thus the bit line BL may be at a low level in the sense amplification period according to the amplification result. The memory controller 100 may determine that bonding to the node $N'_{b1}$ is defective in response to the bit line BL being at a low level.

When the bonding to the node $N'_{b1}$ is defective and at least one of bondings to the nodes $N'_{b1b0}$ to $N'_{b1bn}$ is defective, the voltage of the node $N'_{b1}$ may become lower than the average voltage value of the nodes $N'_{b1b0}$ to $N'_{b1bn}$, and thus the bit line BL may be at a low level in the sense amplification period according to the amplification result. The memory controller 100 may determine that bonding to the node $N'_{b1}$ is defective in response to the bit line BL being at a low level. Although at least one bonding among the bonding to the nodes $N'_{b1b0}$ to $N'_{b1bn}$ is defective, the average voltage value of the complementary bit lines BLB #0 to BLB #n may be close to the voltage value when the bonding is normal such that the average voltage value is higher than that of the node $N'_{b1}$.

Hereinabove, the memory controller 100 determines whether or not the bonding of the node $N'_{b1}$ is defective according to the level of the bit line BL, but it may be implemented such that whether or not the bonding of the node $N'_{b1}$ is defective is determined according to the level of the complementary bit lines BLB #0 to BLB #n.

The cell area 1130 may include cell strings 1131 to 1134. The cell strings 1131 to 1134 may include a plurality of memory cells connected in series. The cell string 1131 may be connected to the bit line BL, and the cell strings 1132 to 1134 may be respectively connected to the complementary bit lines BLB #0 to BLB #n.

The bonding area 1120 may connect the sense amplifier area 1110 and the cell area 1130 through the bit line BL and the complementary bit lines BLB #0 to BLB #n.

Figure 12:
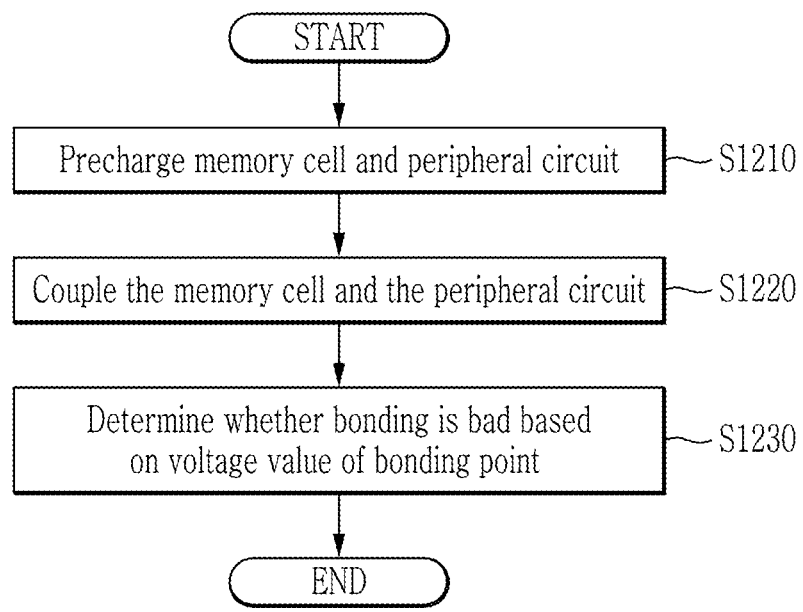
FIG. 12 is a flowchart of a defect detection method according to some embodiments.

FIG. 12 is a flowchart of a defect detection method according to some embodiments.

Referring to FIG. 12, a memory device may be pre-charged by applying the same voltage to a memory cell and a peripheral circuit bonded to the memory cell, respectively (S1210). The memory cell may be formed in the first area, and the peripheral circuit may be formed in the second area. Each of the first area and the second area may be implemented as a different die. A bonding area may be positioned between the first area and second area.

A memory device may connect the memory cell and the peripheral circuit (S1220). In some embodiments, the peripheral circuit may include a switch connected to the first area. The switch may be opened in a pre-charge period and may be closed in a sensing period following the pre-charge period. The switch connects the memory cell and the peripheral circuit, and may be in the second area. The memory device may open the switch in the pre-charge period and close the switch in the sensing period. The switch may be implemented as a first transistor. A memory device may open and close a switch based on a threshold voltage.

The memory device may determine whether bonding between the memory cell and the peripheral circuit is defective based on a voltage value of a bonding point of the peripheral circuit (S1230). The peripheral circuit may further include a latch storing a predetermined value in advance and a second transistor of which a source and a drain are connected to the latch. For example, the predetermined value may be "1". A gate of the transistor may be connected to the switch at a sensing node. When a voltage of the sensing node exceeds the threshold voltage of the second transistor after the memory cell and the peripheral circuit are connected, the second transistor may be turned on and the predetermined value may be switched in advance. When the voltage of the sensing node does not exceed the threshold voltage of the transistor after the memory cell and the peripheral circuit are connected, the second transistor may be turned off such that the predetermined value may maintain its existing value rather than being changed. The memory controller may determine that bonding is normal when the value of the latch is changed, and may determine that bonding is defective when the latch maintains the value.

Figure 13:
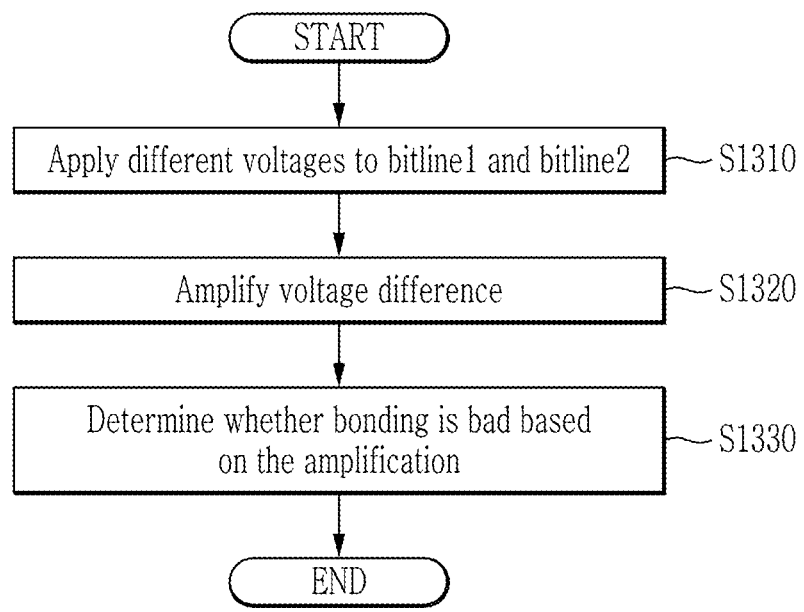
FIG. 13 is a flowchart of a defect detection method according to some embodiments.

FIG. 13 is a flowchart of a defect detection method according to some embodiments.

Referring to FIG. 13, a memory device may apply a different voltage to a first bit line and a second bit line (S1310). For example, the memory device may apply a first voltage to the first bit line, and may apply a second voltage that is lower than the first voltage to the second bit line. The first bit line and the second bit line may connect a cell area and a peripheral circuit area of the memory device. The cell area and the peripheral circuit area may be divided into different dies. That is, a bonding area may be positioned between the cell area and the peripheral circuit area. It may be understood that the resistor and the capacitor according to the parasitic resistance and parasitic capacitance of the bonding area may be in the first bit line and the second bit line. The memory device may apply a voltage to the bit line during the pre-charge period.

The memory device may amplify a voltage difference between the first bit line and the second bit line (S1320). In some embodiments, when bonding to the first bit line is defective, the voltage of the first bit line may be lower than the voltage of the second bit line at the end of the pre-charge period due to voltage drop due to the parasitic resistance. As a result of amplification of the memory device, the voltage of the first bit line may be at a low level, and the voltage of the second bit line may be at a high level. In some embodiments, when all bonding is normal, the voltage of the first bit line may be higher than the voltage of the second bit line at the end of the pre-charge period. As a result of amplification of the memory device, the voltage of the first bit line may be at a high level, and the voltage of the second bit line may be at a low level. The memory device may amplify a voltage difference in a sense amplification period following the pre-charge period.

The memory device may determine whether bonding is defective based on the amplification result (S1330). The memory device may determine that bonding to the first bit line is defective when the voltage of the first bit line is at a low level as a result of the amplification. The memory device may determine that bonding to the first bit line is normal when the voltage of the first bit line is high as a result of the amplification.

Figure 14:
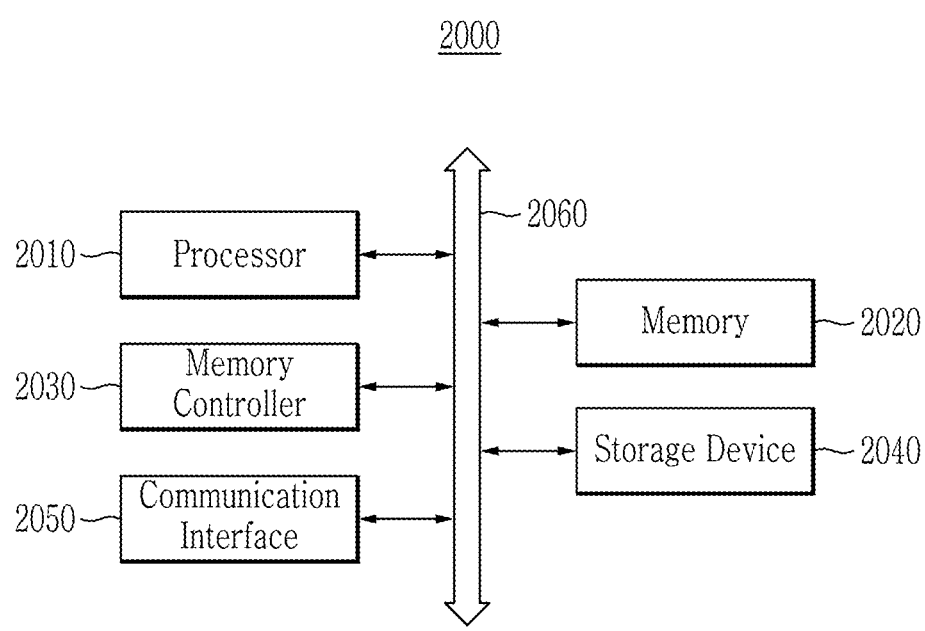
FIG. 14 is a schematic block diagram of a computing system according to some embodiments.

FIG. 14 is a schematic block diagram of a computing system according to some embodiments.

Referring to FIG. 14, a computing device 2000 may include a processor 2010, a memory 2020, a memory controller 2030, a storage device 2040, a communication interface 2050, and a bus 2060. The computing device 2000 may further include other general constituent elements.

The processor 2010 may control the overall operation of each component of the computing device 2000. The processor 2010 may be implemented as at least one of various processing units, such as a central processing unit (CPU), an application processor (AP), and a graphics processing unit (GPU).

The memory 2020 may store various data and instructions. The memory 2020 may be implemented with the memory device described with reference to FIG. 1 to FIG. 13. The memory controller 2030 may control the transfer of data or instructions to and from the memory 2020. The memory controller 2030 may be implemented with the memory controller described with reference to FIG. 1 to FIG. 13. In some embodiments, the memory controller 2030 may be provided as a separate chip from the processor 2010. In some embodiments, the memory controller 2030 may be provided as an internal configuration of the processor 2010.

The storage device 2040 may non-temporarily store programs and data. In some embodiments, the storage device 2040 may be implemented with a non-volatile memory. The communication interface 2050 may support wired/wireless communication (e.g., Internet communication) of the computing device 2000. In addition, the communication interface 2050 may support various communication methods other than Internet communication. The bus 2060 may provide a communication function between constituent elements of the computing device 2000. The bus 2060 may include at least one type of bus according to a communication protocol between constituent elements.

In some embodiments, each constituent element or a combination of two or more constituent elements described with reference to FIG. 1 to FIG. 14 may be implemented as a digital circuit, a programmable or non-programmable logic device or array, an application specific integrated circuit (ASIC), and the like.

While the inventive concepts has been described in connection with what are presently considered to be practical examples of embodiments thereof, it is to be understood that the present disclosure is not limited to the disclosed embodiments. On the contrary, it is intended to cover various modifications and equivalent arrangements included within the scope of the appended claims.

What is claimed is:

1. A semiconductor device comprising:
    a memory device that includes a memory cell, a page buffer, and a first switch, wherein a first end of the first switch is electrically connected to a first node located at a bonding point of the memory cell and a second end of the first switch is connected to a second node located at the page buffer; and
    a memory controller that is configured to apply a pre-charge voltage to the first node and the second node during a first period, to close the first switch in a second period following the first period, and to determine whether bonding between the memory cell and the first switch is defective based on a voltage of the second node after the first switch is closed.

2. The semiconductor device of claim 1, wherein
    the memory controller is configured to open the first switch during the first period.

3. The semiconductor device of claim 1, further comprising:
    a second switch configured to pass the pre-charge voltage to the first node in the first period; and
    a third switch configured to pass the pre-charge voltage to the second node in the first period.

4. The semiconductor device of claim 3, wherein
    the memory controller is configured to open the second switch and the third switch during the second period.

5. The semiconductor device of claim 1, wherein the page buffer comprises:
    a latch that is configured to maintain a first level during the first period; and
    a transistor that is connected between an input terminal of the latch and a line that transmits a second level, and operates in response to a voltage of the second node, and
    wherein the memory controller is configured to determine whether the bonding is defective based on a logic level of the latch in the second period.

6. The semiconductor device of claim 1, wherein the page buffer comprises:
    a latch that is configured to maintain a first level during the first period; and
    a transistor that is configured to cause a logic level of the latch to be maintained at the first level or to be changed to a second level, based on a voltage of the second node during the second period, and
    wherein the memory controller is configured to determine whether the bonding is defective based on a logic level of the latch in the second period.

7. The semiconductor device of claim 6, wherein a gate of the transistor is connected with the second node, and a source or a drain of the transistor is connected with the latch.

8. The semiconductor device of claim 6, wherein the memory controller is configured to determine that the bonding is defective if the latch is at the first level, and determines that the bonding is normal if the latch is at the second level.

9. The semiconductor device of claim 6, wherein an application time and a value of the pre-charge voltage are predetermined in order for the voltage of the second node to exceed a threshold voltage of the transistor at a time that the first period ends when the bonding is normal.

10. The semiconductor device of claim 6, further comprising a sensing circuit that measures a voltage of the first node at a time that the first period ends,
wherein the memory controller is configured to determine that the bonding is defective when the voltage of the first node exceeds a threshold voltage of the transistor at the time that the first period ends, and
wherein the memory controller is configured to determine that the bonding is normal when the voltage of the first node does not exceed the threshold voltage of the transistor at the time that the first period ends.

11. A semiconductor device comprising:
a memory device that includes: a plurality of bit lines connected to a plurality of memory cells; a pre-charge circuit that is configured to pre-charge a first bit line among the plurality of bit lines with a first voltage and pre-charge a second bit line with a second voltage that is lower than the first voltage; and a sense amplifier that is configured to amplify a voltage difference between the first bit line and the second bit line and output the amplified voltage difference; and
a memory controller that is configured to determine whether bonding of the plurality of memory cells is defective based on the output from the sense amplifier.

12. The semiconductor device of claim 11, wherein the memory controller is configured to control the pre-charge circuit so that the first bit line is pre-charged with the first voltage and the second bit line is pre-charged with the second voltage.

13. The semiconductor device of claim 12, wherein the memory controller is configured to determine whether the bonding is defective based on the output from the sense amplifier.

14. The semiconductor device of claim 11, wherein the plurality of memory cells is positioned in a first area, wherein the pre-charge circuit and the sense amplifier are positioned in a second area bonded to the first area, and wherein the memory controller is configured to determine whether bonding of the first area and the second area is defective.

15. The semiconductor device of claim 11, wherein the memory controller is configured to determine that the bonding is normal when a voltage of the first bit line is higher than a voltage of the second bit line.

16. The semiconductor device of claim 11, wherein the memory controller is configured to determine that the bonding is defective when a voltage of the second bit line is higher than a voltage of the first bit line.

17. The semiconductor device of claim 11, wherein the memory controller is configured to determine that the bonding is normal when a voltage of the first bit line is higher than the first voltage.

18. The semiconductor device of claim 11, wherein the memory controller is configured to determine that the bonding is defective when a voltage of the first bit line is lower than the second voltage.

19. The semiconductor device of claim 11, wherein the sense amplifier is connected to the first bit line, the second bit line, and a third bit line among the plurality of bit lines, and wherein the sense amplifier is configured to amplify a difference between a voltage of the first bit line and an average voltage value of a voltage of the second bit line and a voltage of the third bit line.

20. A semiconductor device comprising:
a memory cell;
a page buffer;
a first switch having a first end that is connected with the memory cell at a first node and a second end that is connected with the page buffer at a second node;
a second switch that is connected between a power source configured to supply a pre-charge voltage and the first node; and
a third switch connected between the power source and the second node,
wherein the page buffer comprises:
a latch; and
a transistor that is connected between an input terminal of the latch and a ground terminal, and having a gate connected to the second node.

* * * * *